(12) United States Patent
Wu et al.

(10) Patent No.: US 9,674,978 B2
(45) Date of Patent: Jun. 6, 2017

(54) PLUG-IN MECHANISM, SUBRACK INCLUDING PLUG-IN MECHANISM, AND FINISHED BOARD

(71) Applicant: Huawei Technologies Co., Ltd., Shenzhen, Guangdong (CN)

(72) Inventors: Dingqiang Wu, Shenzhen (CN); Dongli Wang, Shenzhen (CN); Yao Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 221 days.

(21) Appl. No.: 14/577,724

(22) Filed: Dec. 19, 2014

(65) Prior Publication Data

US 2015/0103492 A1 Apr. 16, 2015

Related U.S. Application Data

(63) Continuation of application No. PCT/CN2013/070906, filed on Jan. 23, 2013.

(30) Foreign Application Priority Data

Jul. 20, 2012 (CN) .......................... 2012 1 0253445

(51) Int. Cl.
*H05K 7/14* (2006.01)
*G06F 1/18* (2006.01)

(52) U.S. Cl.
CPC ........... *H05K 7/1461* (2013.01); *G06F 1/185* (2013.01); *H05K 7/1431* (2013.01); *H05K 7/1487* (2013.01); *H05K 7/1488* (2013.01)

(58) Field of Classification Search
CPC .......... G06F 1/184; G06F 1/185; G06F 1/186; G06F 1/187; H05K 7/1487; H05K 7/1461; H05K 7/1431; H05K 7/1488; H01R 13/629; H01R 13/62905; H01R 13/62922; H01R 13/62933; H01R 13/62938;
(Continued)

(56) References Cited

U.S. PATENT DOCUMENTS 4,801,235 A * 1/1989 Rauschdorf .......... B65G 47/915
                                                    414/225.01
5,481,431 A * 1/1996 Siahpolo ................. G06F 1/184
                                                    361/679.31
(Continued)

FOREIGN PATENT DOCUMENTS

CN        201345793 Y     11/2009
CN        101873781 A     10/2010
(Continued)

*Primary Examiner* — Courtney Smith
*Assistant Examiner* — Christopher L Augustin

(57) ABSTRACT

Embodiments of the present invention disclose a plug-in mechanism, a subrack including the plug-in mechanism, and a finished board, and relate to a power mechanism, so as to implement fast and reliable plug-in and plug-out by using a lever assistance effect, and a gearing effect of a parallelogram mechanism. The plug-in mechanism provided by an embodiment of the present invention is configured to be disposed between a sub-carrier frame and a parent carrier frame to implement plug-in and plug-out of the sub-carrier frame in the parent carrier frame, and the plug-in mechanism includes a driving part and a gearing part.

17 Claims, 2 Drawing Sheets

(58) Field of Classification Search
CPC ........ H01R 13/62966; H01R 13/62972; H01R 13/62977
See application file for complete search history.

(56) References Cited

U.S. PATENT DOCUMENTS

| | | | | |
|---|---|---|---|---|
| 5,587,879 | A * | 12/1996 | Spano | G06F 1/184 |
| | | | | 361/679.31 |
| 5,657,204 | A * | 8/1997 | Hunt | H05K 7/1409 |
| | | | | 361/752 |
| 6,461,180 | B2 * | 10/2002 | Baertsoen | H01R 12/88 |
| | | | | 439/157 |
| 7,145,780 | B2 * | 12/2006 | Malone | H05K 7/1421 |
| | | | | 361/752 |
| 7,771,218 | B2 * | 8/2010 | Jaramillo | H05K 7/1492 |
| | | | | 439/157 |
| 9,122,458 | B2 * | 9/2015 | Yu | G06F 1/185 |
| 2004/0017650 | A1 * | 1/2004 | Liu | G06F 1/187 |
| | | | | 361/679.33 |
| 2004/0190416 | A1 | 9/2004 | Kakiuchi | |
| 2010/0033924 | A1 | 2/2010 | Olesiewicz et al. | |
| 2010/0134988 | A1 * | 6/2010 | Zheng | G06F 1/185 |
| | | | | 361/756 |
| 2012/0240704 | A1 | 9/2012 | Li et al. | |

FOREIGN PATENT DOCUMENTS

| | | |
|---|---|---|
| CN | 101986774 A | 3/2011 |
| CN | 102791103 A | 11/2012 |
| JP | 2004280976 A | 10/2004 |

* cited by examiner

PLUG-IN MECHANISM, SUBRACK INCLUDING PLUG-IN MECHANISM, AND FINISHED BOARD

CROSS-REFERENCE TO RELATED APPLICATIONS

This application is a continuation of International Application No. PCT/CN2013/070906, filed on Jan. 23, 2013, which claims priority to Chinese Patent Application No. 201210253445.1, filed on Jul. 20, 2012, both of which are hereby incorporated by reference in their entireties.

TECHNICAL FIELD

The present invention relates to a power mechanism, and in particular, to a plug-in mechanism, a subrack including the plug-in mechanism, and a finished board.

BACKGROUND

As people impose an increasingly high requirement on performance of a high-end server, more central processing units (Central Processing Unit, CPU for short) and dual in-line memory modules (Dual In-line Memory Modules, DIMM for short) are required on a single node. Because dimensions of a chassis restrict a size of a printed circuit board (Printed Circuit Board, PCB for short), improving hardware density becomes an orientation of efforts in the industry. In an existing method, on a basis of placing a CPU and a DIMM on a traditional single-layer mainboard, a CPU and a DIMM are placed on both the mainboard and a daughter board by combining the mainboard with the daughter board, and then the mainboard and the daughter board are connected by using a connector.

In the prior art, a manner for mounting a daughter board and a mainboard is generally: mounting a stud on the mainboard, and after a connector on the daughter board is adapted to a connector on the mainboard, connecting the daughter board to the stud by using a screw, so as to implement fastening of the mainboard and the daughter board.

However, the manner for mounting a daughter board and a mainboard in the prior art has at least the following defects:

1. Stud strength at each corner tends to be different, which causes imbalance of the daughter board or fragility of mounting and further causes local deformation or even fracture of the daughter board.

2. When the daughter board is being detached, a large force is required for disengaging the connector, which tends to cause damage to the daughter board.

3. An additional tool, such as a screwdriver, is required for detaching the daughter board, it takes a long time to perform a replacement, and screw-free mounting cannot be implemented.

SUMMARY

Embodiments of the present invention provide a plug-in mechanism, a subrack including the plug-in mechanism, and a finished board, so as to implement fast and reliable plug-in and plug-out by using a lever assistance effect, and a gearing effect of a parallelogram mechanism.

To achieve the foregoing objective, the embodiments of the present invention adopt the following technical solutions:

According to one aspect, an embodiment of the present invention provides a plug-in mechanism, where the plug-in mechanism is configured to be disposed between a sub-carrier frame and a parent carrier frame to implement plug-in and plug-out of the sub-carrier frame in the parent carrier frame, and the plug-in mechanism includes a driving part and a gearing part, where:

the driving part includes an ejector lever; and the gearing part includes at least two mutually-parallel rotating connecting rods, one end of each of the rotating connecting rods is fastened onto the sub-carrier frame by using a rotating shaft, two of the rotating connecting rods that are adjacent are connected at the other end by using a translational connecting rod, the rotating connecting rod located on one side is connected to the ejector lever, and at least one of the rotating connecting rods is connected to the parent carrier frame by using a linkage structure.

According to one aspect, an embodiment of the present invention provides a subrack, including a sub-carrier frame and a parent carrier frame, where a plug-in mechanism is disposed on two opposite sides of the sub-carrier frame and two corresponding sides of the parent carrier frame.

According to one aspect, an embodiment of the present invention provides a finished board, including a daughter board, a mainboard, and a subrack, where the daughter board and the mainboard are disposed in a sub-carrier frame and a parent carrier frame respectively, and plug-in and plug-out of the sub-carrier frame in the parent carrier frame implement connection and detachment between the daughter board and the mainboard.

According to the plug-in mechanism, the subrack including the plug-in mechanism, and the finished board provided by the embodiments of the present invention, fast and reliable plug-in and plug-out are implemented by using a lever assistance effect, and a gearing effect of a parallelogram mechanism. Therefore, the following problems are addressed: When a stud and a screw are used for connection, strength of a copper stud at each corner is different, which causes imbalance of a daughter board or fragility of mounting, and further causes local deformation or even fracture of the daughter board; when the daughter board is being detached, a large force is required for disengaging a connector, which tends to cause damage to the daughter board; and an additional tool, such as a screwdriver, is required for detaching the daughter board, it takes a long time to perform a replacement, and screw-free mounting cannot be implemented.

BRIEF DESCRIPTION OF THE DRAWINGS

To describe the technical solutions in the embodiments of the present invention or in the prior art more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 1:
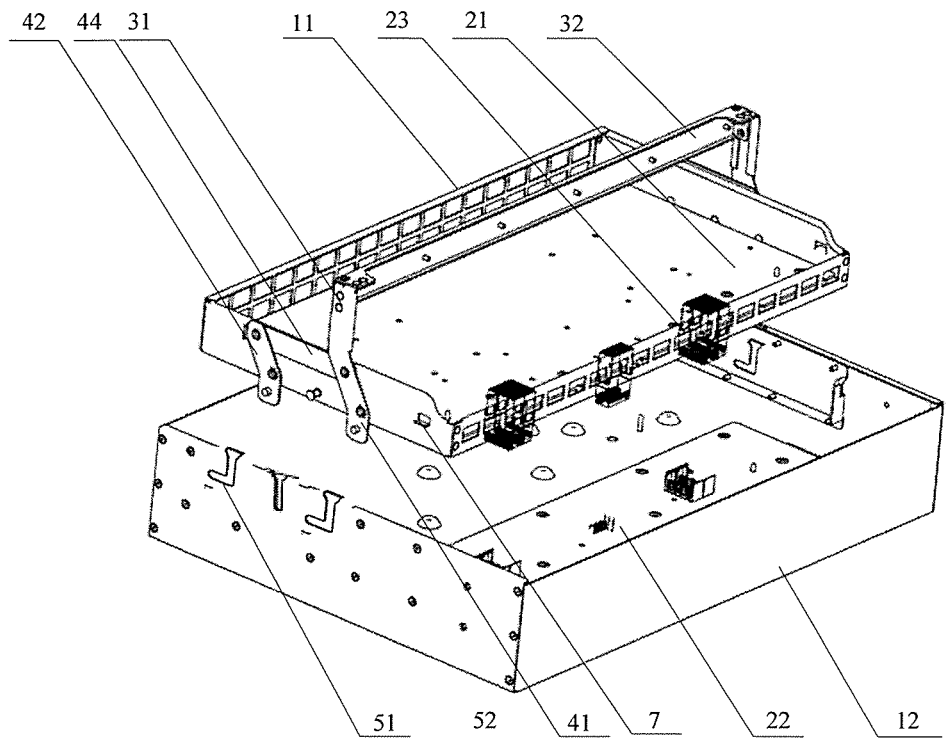
FIG. 1 is a schematic structural diagram of a finished board according to an embodiment of the present invention.

Referring to FIG. 1, an embodiment of the present invention provides a plug-in mechanism 100, a subrack 1 including the plug-in mechanism 100, and a finished board 2. An embodiment of the plug-in mechanism 100 is included in an embodiment of the subrack 1, and an embodiment of a subrack 1 is included in an embodiment of the finished board 2, and therefore, embodiments of the plug-in mechanism 100 and the subrack 1 are not independently described again.

The finished board 2 includes the subrack 1, a daughter board 21, and a mainboard 22. The subrack 1 includes a sub-carrier frame 11 and a parent carrier frame 12, and the plug-in mechanism 100 that is disposed between the parent carrier frame 12 and the sub-carrier frame 11. By using the plug-in mechanism 100, plug-in and plug-out of the sub-carrier frame 11 in the parent carrier frame 12 can be implemented. The daughter board 21 and the mainboard 22 are disposed in the sub-carrier frame 11 and the parent carrier frame 12 respectively. For example, the mainboard 22 is disposed at a bottom of the sub-carrier frame 11, and the daughter board 21 is disposed at a bottom of the parent carrier frame 12; or, the mainboard 22 is disposed at a bottom of the parent carrier frame 12, and the daughter board 21 is disposed at a bottom of the sub-carrier frame 11. The mainboard 22 and the daughter board 21 may be connected to the sub-carrier frame 11 and the parent carrier frame 12 by means of screw fastening; or, preferably, in order to facilitate detachment, may also be connected by means of clamping, for example, may be connected by means of turtleback clamping. A CPU and a DIMM are placed on each of the daughter board 21 and the mainboard 22, a connector 23 is disposed on the daughter board 21 and the mainboard 22, and a free end of the connector 23 disposed on the daughter board 21 can be plug-connected to a free end of the connector 23 disposed on the mainboard 22. For example, multiple jacks and pins are provided at the free end of the connector 23 disposed on the daughter board 21 and at the free end of the connector 23 disposed on the mainboard 22, a position of a jack at the free end of the connector 23 on the daughter board 21 is corresponding to a position of a pin at the free end of the connector 23 on the mainboard 22, and a position of a pin at the free end of the connector 23 on the daughter board 21 is corresponding to a position of a jack at the free end of the connector 23 on the mainboard 22, thereby implementing plug-connection of the connector 23.

The following describes a structure of the plug-in mechanism 100 and a process of mounting and detaching the daughter board 21 and the mainboard 22 by using an example that the mainboard 22 is disposed at a bottom of the parent carrier frame 12 and the daughter board 21 is disposed at a bottom of the sub-carrier frame 11.

The plug-in mechanism 100 is disposed on two opposite sides of the subrack 2, which ensures levelness and steadiness of the entire mechanism in a plug-in and plug-out process and prevents deformation of the daughter board.

The plug-in mechanism 100 on each side includes a driving part 3 and a gearing part 4, where:

the driving part 3 includes an ejector lever 31; and the gearing part 4 includes two mutually-parallel rotating connecting rods, that is, a first rotating connecting rod 41 and a second rotating connecting rod 42; one end of each of the first rotating connecting rod 41 and the second rotating connecting rod 42 is fastened onto the sub-carrier frame 11 by using a rotating shaft 43; the first rotating connecting rod 41 and the second rotating connecting rod 42 are connected at the other end by using a translational connecting rod 44, where the translational connecting rod 44 is connected to the first rotating connecting rod 41 and the second rotating connecting rod 42 in a rotating manner; the first rotating connecting rod 41 is connected to the ejector lever 31; and each of the first rotating connecting rod 41 and the second rotating connecting rod 42 is connected to the parent carrier frame 12 by using a linkage structure 5.

Exemplarily, referring to FIG. 1, outline dimensions of the sub-carrier frame 11 are slightly smaller than interior dimensions of the parent carrier frame 12, which ensures that the sub-carrier frame 11 can be plugged into the parent carrier frame 12. Mutually coordinating guide rails may be disposed on an inner sidewall of the parent carrier frame 12 and an outer sidewall of the sub-carrier frame 11. By using the guide rails, the sub-carrier frame 11 can slide into the parent carrier frame 12.

Figure 2:
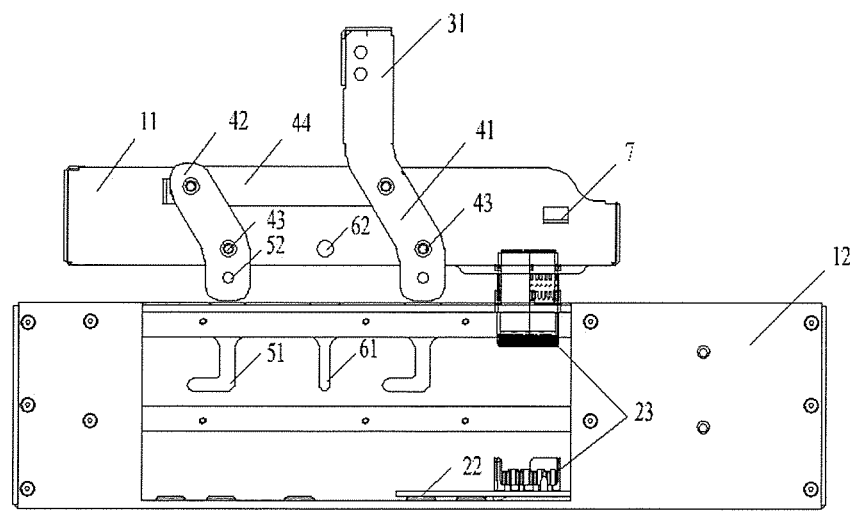
FIG. 2 is a state diagram before a connector of the finished board shown in FIG. 1 is connected.
Figure 3:
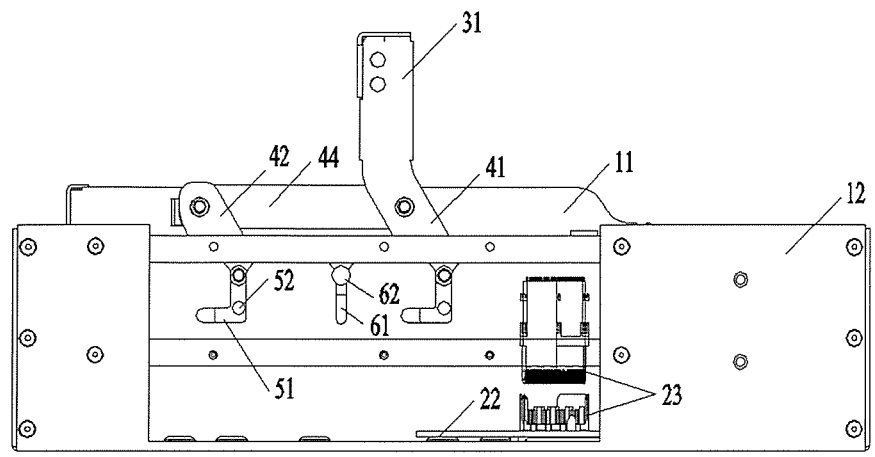
FIG. 3 is a state diagram when a connector of the finished board shown in FIG. 1 begins connecting.
Figure 4:
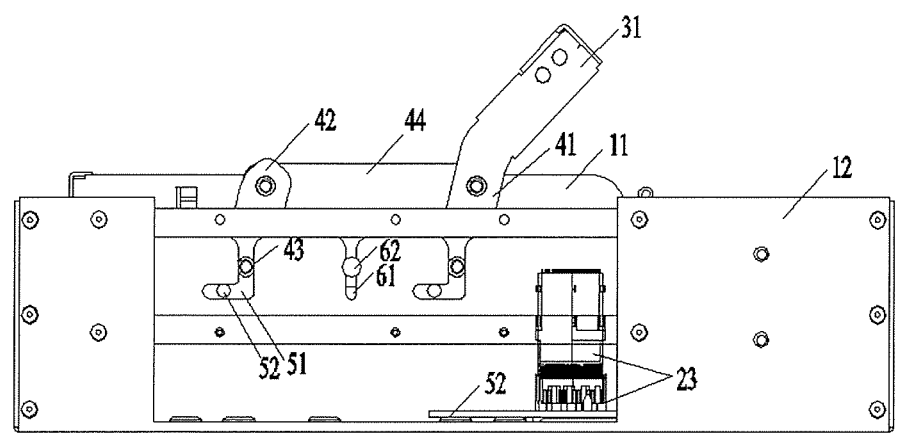
FIG. 4 is a state diagram in a connection process of a connector of the finished board shown in FIG. 1.
Figure 5:
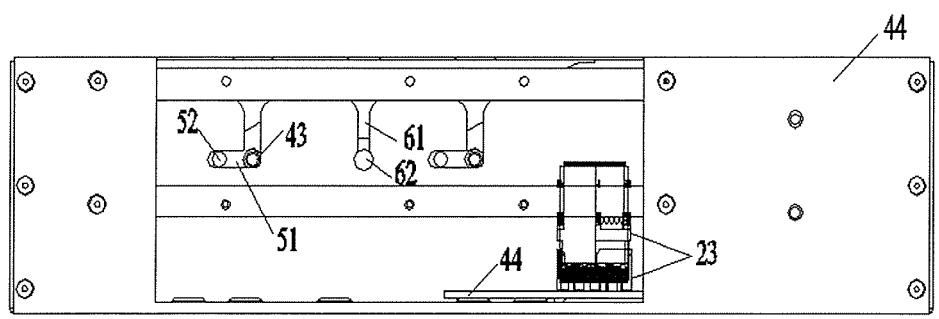
FIG. 5 is a state diagram after a connector of the finished board shown in FIG. 1 is connected effectively.

FIG. 2 to FIG. 5 show a process of mounting and detaching the daughter board 21 and the mainboard 22, where FIG. 2 is a state diagram before the connector 23 of the daughter board 21 is connected to that of the mainboard 22; FIG. 3 is a state diagram when the connector 23 of the daughter board 21 begins connecting to that of the mainboard 22; FIG. 4 is a state diagram in a process in which the connector 23 of the daughter board 21 is connected to that of the mainboard 22; and FIG. 5 is a state diagram after the connector 23 of the daughter board 21 is effectively connected to that of the mainboard 22.

As shown in FIG. 2, first, the daughter board 21 and the mainboard 22 are mounted onto the sub-carrier frame 11 and the parent carrier frame 12 respectively, and the connector 23 on the daughter board 21 is not connected to that on the mainboard 22. As shown in FIG. 3, the parent carrier frame 12 is placed upward horizontally, and the sub-carrier frame 11 slides into the parent carrier frame 12 downward horizontally along a guide rail and gets in position. As shown in FIG. 4, the ejector lever 31 is pulled downward, and the ejector lever 31 drives the first rotating connecting rod 41 to rotate downward around the rotating shaft 43; meanwhile, the translational connecting rod 44 drives the second rotating connecting rod 42 to rotate downward around the rotating shaft 43, the first rotating connecting rod 41 and the second rotating connecting rod 42 apply an upward force to the parent carrier frame 12 by using the linkage structure 5 and are meanwhile subject to a downward counter-acting force from the parent carrier frame 12; and because the parent carrier frame 12 is fastened, the downward counter-acting force from the parent carrier frame 12 drives the sub-carrier frame 11 to move downward and be plugged into the parent carrier frame 12, the daughter board 21 in the sub-carrier frame 11 moves downward with the sub-carrier frame 11, and the connector 23 on the daughter board 21 begins connecting to that on the mainboard 22. As shown in FIG. 5, the connector 23 of the daughter board 21 is effectively connected to that of the mainboard 22, thereby completing mounting of the daughter board 21 and the mainboard 22; and on the contrary, when the ejector lever 31 is pulled upward, the first rotating connecting rod 41 and the second rotating connecting rod 42 drive, by using the linkage structure 5, the sub-carrier frame 11 to move upward, and the connector 23 on the daughter board 21 is disengaged from that on the mainboard 22, thereby completing detachment of the daughter board 21 and mainboard 22.

Certainly, the parent carrier frame 12 may also be placed upright, and then, after the sub-carrier frame 11 slides into the parent carrier frame 12 horizontally along the guide rail and gets in position, the ejector lever 31 is pulled, so that the sub-carrier frame 11 is plugged into the parent carrier frame 12 along a horizontal direction, thereby completing mounting of the daughter board 21 and the mainboard 22; and the ejector lever 31 is pulled along a reverse direction, so that the sub-carrier frame 11 is unplugged from the parent carrier frame 12 along the horizontal direction, thereby completing detachment of the daughter board 21 and the mainboard 22. When the mainboard 22 is disposed in the sub-carrier frame 11 and the daughter board 21 is disposed in the parent carrier frame 12, a principle and an implementation manner are the same.

Preferably, referring to FIG. 2 to FIG. 5, the linkage structure 5 may include a horizontal groove 51, and a linkage stud 52 that can slide in the horizontal groove 51. The linkage structure 5 of such a structure has a simple structure and is easy to operate. The linkage stud 52 may be disposed on the first rotating connecting rod 41 and the second rotating connecting rod 42, and the horizontal groove 51 is provided on the parent carrier frame 12; or the linkage stud 52 may be disposed in the parent carrier frame 12, and the horizontal groove 51 is provided on the first rotating connecting rod 41 and the second rotating connecting rod 42. An exemplary manner is: The linkage stud 52 is disposed on the first rotating connecting rod 41 and the second rotating connecting rod 42, and the horizontal groove 51 is provided on the parent carrier frame 12. Because the first rotating connecting rod 41 and the second rotating connecting rod 42 have a certain thickness, mounting strength of the linkage stud 52 can be enhanced, disengagement of the linkage stud 52 is prevented effectively, and reliability of the mechanism is improved. A linkage process of the linkage structure 5 of such a structure is: When the first rotating connecting rod 41 and the second rotating connecting rod 42 rotate downward under an effect of the ejector lever 31, the linkage stud 52 fastened on the first rotating connecting rod 41 and the second rotating connecting rod 42 should perform corresponding arc rotation upward. Restricted by the horizontal groove 51 fastened on the parent carrier frame 12, the linkage stud 52 on the first rotating connecting rod 41 and the second rotating connecting rod 42 moves horizontally along the horizontal groove 51 eventually. The linkage stud 52 generates an upward acting force onto the horizontal groove 51, and is meanwhile subject to a downward counter-acting force from the horizontal groove 51. Under the downward counter-acting force from the horizontal groove 51, the linkage stud 52 drives the sub-carrier frame 11 to move downward, thereby completing mounting of the daughter board 21 and the mainboard 22. When the ejector lever 31 is pulled in a reverse direction, detachment of the daughter board 21 and the mainboard 22 is completed.

Preferably, the gearing part 4 may include three or more mutually-parallel rotating connecting rods. Each rotating connecting rod is fastened onto the sub-carrier frame 11 by using the rotating shaft 43. Two adjacent rotating connecting rods are connected by using a translational connecting rod, and each rotating connecting rod is connected to the parent carrier frame 12 by using the linkage structure 5.

An effect of the gearing part 4 using three or more mutually-parallel rotating connecting rods is: During a plug-in and plug-out process, a plurality of force application points are generated, so that an operation during the plug-in and plug-out process is steadier and more reliable, a force required at each force application point is smaller, an operation becomes simpler and easier, and a service life of the linkage stud 52 can also be extended. Especially in a case in which the number of connectors 23 is large and a large force is required for plug-in and plug-out, a better effect can be achieved. It should be noted that, when the linkage structure 5 is used to connect only one rotating connecting rod to the parent carrier frame 12, plug-in and plug-out of the sub-carrier frame 11 in the parent carrier frame 12 may also be implemented, which, however, requires a larger force.

Preferably, the plug-in mechanism 100 may further include a guide structure 6. A purpose of the guide structure 6 is to achieve a guiding effect in a movement process of the sub-carrier frame 11, and help with accurate plug-connection between the connector 23 on the daughter board 21 and that on the mainboard 22. The guide structure 6 may include a guide groove 61, and a guide stud 62 that slides in the guide groove 61. An extension direction of the guide groove 61 is mutually perpendicular to an extension direction of the horizontal groove 51, that is, the extension direction of the guide groove 61 is consistent with the movement direction in the plug-in and plug-out of the sub-carrier frame 11 in the parent carrier frame 12. For example, in a case in which the sub-carrier frame 11 is plugged into the parent carrier frame 12 in an upright state, the guide groove 61 is in an upright state; and in a case in which the sub-carrier frame 11 is plugged into the parent carrier frame 12 in a horizontal state, the guide groove 61 extends along a horizontal direction, but is perpendicular to the extension direction of the horizontal groove 61. The guide structure 6 may include more than two groups of guide grooves 61 and guide studs 62, which cooperate with each other and are symmetrically disposed on sides of a carrier frame 1 in which the plug-in mechanism 100 is located. In this embodiment, two groups of guide grooves 61 and guide studs 62 are included and distributed in the middle of two rotating connecting rods that are on two sides of the carrier frame 1 in which the plug-in mechanism 100 is located, so that a guiding force is evener, and guiding is smooth. Specifically, the guide groove 61 is provided on the parent carrier frame 12, and the guide stud 62 is disposed on the sub-carrier frame 11. Certainly, the guide groove 61 may also be provided on the sub-carrier frame 11, and the guide stud 62 may be disposed on the parent carrier frame 12.

Exemplarily, an optional structure of the guide structure 6 may also include a guide rod 63 and a guide hole 64 into which the guide rod can be inserted. In a process of plugging the sub-carrier frame 11 into the parent carrier frame 12, an end of the guide rod 63 is inserted into the guide hole 64 correspondingly, which can also achieve a guiding effect. The guide structure 6 may include multiple groups of guide rods 63 and guide holes 64 that cooperate with each other. When the multiple groups of guide rods 63 and guide holes 64 that cooperate with each other are distributed symmetrically or evenly, the guiding force is evener, and the guiding effect is better. Specifically, the guide rod 63 may be permanently disposed on the mainboard 22, and the guide hole 64 is correspondingly provided on the daughter board 21; or the guide rod 63 may be permanently disposed on the daughter board 21, and the guide hole 64 is correspondingly provided on the mainboard 22. An optional manner of fastening may be riveting or the like. The guide rod 63 may also directly be a long rivet.

Preferably, a position-limit part 7 is further disposed at one end near the ejector lever 31 on the sub-carrier frame 11, and is configured to lock a position of the ejector lever 31 after the sub-carrier frame 11 is plugged in position. The position-limit part 7 may be an elastic latch hook structure or a bump structure. After the connector 23 on the daughter board 21 is effectively connected to that on the mainboard 22, the ejector lever 31 is clasped by the position-limit part 7, so as to prevent the connector 23 from being crushed. In actual application, a rotational angle of the ejector lever 31 may be calculated according to a distance from initial positions of the connectors 23 on the daughter board 21 and the mainboard 22 to positions of the connectors after the connectors are connected effectively, and further, a specific position of the position-limit part 7 is determined.

Preferably, ejector levers 31 of plug-in mechanisms 100 located on two sides of the carrier frame 1 are connected by using a connecting rod 32, which can implement linkage between the plug-in mechanisms 100 on the two sides of the carrier frame 1 and enable the entire mechanism to be steadier in the plug-in and plug-out process.

According to the plug-in mechanism provided by the embodiment of the present invention, fast and reliable plug-in and plug-out are implemented by using a lever assistance effect, and a gearing effect of a parallelogram mechanism. Therefore, the following problems are addressed: When a stud and a screw are used for connection, strength of each copper stud is different, which causes imbalance of a daughter board or fragility of mounting, and further causes local deformation or even fracture of the daughter board; when the daughter board is being detached, a large force is required for disengaging a connector, which tends to cause damage to the daughter board; and an additional tool, such as a screwdriver, is required for detaching the daughter board, it takes a long time to perform a replacement, and screw-free mounting cannot be implemented.

A person of ordinary skill in the art may understand that all or a part of the steps for implementing the foregoing method embodiments may be performed by a program instructing relevant hardware. The program may be stored in a computer readable storage medium. When the program runs, the steps of the foregoing method embodiments are performed. The foregoing storage medium includes any media that can store program code, such as a ROM, a RAM, a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A plug-in mechanism configured to be disposed between a sub-carrier frame and a parent carrier frame to implement plug-in and plug-out of the sub-carrier frame relative to the parent carrier frame, the plug-in mechanism comprising:

an ejector lever; and a gearing part comprising at least two parallel rotating connecting rods, wherein one end of each of the rotating connecting rods is fastened to the sub-carrier frame by a rotating shaft, two of the rotating connecting rods are adjacent and are connected at the other end by a translational connecting rod, at least one of the rotating connecting rods is connected to the ejector lever, and each of the rotating connecting rods is configured to removably connect to the parent carrier frame by a corresponding linkage structure, each linkage structure comprising a first groove that is open at one end and a linkage stud that is configured to slide into the open end of the first groove.

2. The plug-in mechanism according to claim 1, wherein the linkage stud is disposed on the corresponding rotating connecting rod, and the first groove is provided on the parent carrier frame.

3. The plug-in mechanism according to claim 1, further comprising a guide structure comprising a guide groove and a guide stud that is configured to slide into the guide groove, wherein an extension direction of the guide groove is perpendicular to an extension direction of the first groove.

4. The plug-in mechanism according to claim 3, wherein:

the guide groove is provided on the parent carrier frame, and the guide stud is disposed on the sub-carrier frame;

or the guide groove is provided on the sub-carrier frame, and the guide stud is disposed on the parent carrier frame.

5. The plug-in mechanism according to claim 1, further comprising a position-limit part disposed on the sub-carrier frame and configured to lock a position of the ejector lever after the sub-carrier frame is plugged in position.

6. A subrack, comprising:

a sub-carrier frame and a parent carrier frame; and a plug-in mechanism disposed on two opposite sides of the sub-carrier frame and two corresponding sides of the parent carrier frame, the plug-in mechanism comprising:

an ejector lever, and a gearing part comprising at least two parallel rotating connecting rods, wherein one end of each of the rotating connecting rods is fastened to the sub-carrier frame by a rotating shaft, two of the rotating connecting rods are adjacent and are connected at the other end by a translational connecting rod, at least one of the rotating connecting rods is connected to the ejector lever, and each of the rotating connecting rods is configured to removably connect to the parent carrier frame by a corresponding linkage structure, each linkage structure comprising a first groove that is open at one end and a linkage stud that is configured to slide into the open end of the first groove.

7. The subrack according to claim 6, wherein the linkage stud is disposed on the corresponding rotating connecting rod, and the first groove is provided on the parent carrier frame.

8. The subrack according to claim 6, further comprising a guide structure comprising a guide groove and a guide stud that is configured to slide into the guide groove, wherein an extension direction of the guide groove is perpendicular to an extension direction of the first groove.

9. The subrack according to claim 8, wherein:

the guide groove is provided on the parent carrier frame, and the guide stud is disposed on the sub-carrier frame;

or the guide groove is provided on the sub-carrier frame, and the guide stud is disposed on the parent carrier frame.

10. The subrack according to claim 6, further comprising a position-limit part disposed on the sub-carrier frame and configured to lock a position of the ejector lever after the sub-carrier frame is plugged in position.

11. The subrack according to claim 6, wherein ejector levers of plug-in mechanisms on the two sides are connected by a connecting rod, so as to implement linkage between the plug-in mechanisms on the two sides.

12. A finished board, comprising:
a daughter board and a mainboard; and
a subrack comprising a sub-carrier frame and a parent carrier frame, wherein a plug-in mechanism is disposed on two opposite sides of the sub-carrier frame and two corresponding sides of the parent carrier frame, the plug-in mechanism comprising:
an ejector lever, and
a gearing part comprising at least two parallel rotating connecting rods, wherein one end of each of the rotating connecting rods is fastened to the sub-carrier frame by a rotating shaft, two of the rotating connecting rods are adjacent and are connected at the other end by a translational connecting rod, at least one of the rotating connecting rods is connected to the ejector lever, and each of the rotating connecting rods is configured to removably connect to the parent carrier frame by a corresponding linkage structure, each linkage structure comprising a first groove that is open at one end and a linkage stud that is configured to slide into the open end of the first groove;
wherein the daughter board and the mainboard are disposed in the sub-carrier frame and the parent carrier frame respectively, and plug-in and plug-out of the sub-carrier frame relative to the parent carrier frame implement connection and detachment between the daughter board and the mainboard.

13. The finished board according to claim 12, wherein the linkage stud is disposed on the corresponding rotating connecting rod, and the first groove is provided on the parent carrier frame.

14. The finished board according to claim 12, further comprising a guide structure comprising a guide groove and a guide stud that is configured to slide into the guide groove, wherein an extension direction of the guide groove is perpendicular to an extension direction of the first groove.

15. The finished board according to claim 14, wherein:
the guide groove is provided on the parent carrier frame, and the guide stud is disposed on the sub-carrier frame; or
the guide groove is provided on the sub-carrier frame, and the guide stud is disposed on the parent carrier frame.

16. The finished board according to claim 12, further comprising a position-limit part disposed on the sub-carrier frame and configured to lock a position of the ejector lever after the sub-carrier frame is plugged in position.

17. The finished board according to claim 12, wherein a connector is disposed on the daughter board and the mainboard, and a free end of the connector disposed on the daughter board can be plug-connected to a free end of the connector disposed on the mainboard.

* * * * *